United States Patent [19]
Yamagishi

[11] Patent Number: 6,117,234
[45] Date of Patent: Sep. 12, 2000

[54] SINGLE CRYSTAL GROWING APPARATUS AND SINGLE CRYSTAL GROWING METHOD

[75] Inventor: Hirotoshi Yamagishi, Annaka, Japan

[73] Assignee: Super Silicon Crystal Research Institute Corp., Gunma, Japan

[21] Appl. No.: 09/037,512

[22] Filed: Mar. 10, 1998

[30] Foreign Application Priority Data

Mar. 27, 1997 [JP] Japan ................................ 9-093182
Nov. 25, 1997 [JP] Japan ................................ 9-339429

[51] Int. Cl.$^7$ ................................................ C30B 35/00
[52] U.S. Cl. ..................... 117/218; 117/208; 117/217; 117/911
[58] Field of Search ................................ 117/208, 217, 117/218, 219, 222, 911

[56] References Cited

U.S. PATENT DOCUMENTS

| | | | |
|---|---|---|---|
| 5,126,113 | 6/1992 | Yamagishi et al. | 117/218 |
| 5,879,448 | 3/1999 | Urano et al. | 117/13 |
| 5,882,397 | 3/1999 | Iino et al. | 117/13 |

FOREIGN PATENT DOCUMENTS

| | | |
|---|---|---|
| 0286133 | 10/1988 | European Pat. Off. |
| 0449260 | 10/1991 | European Pat. Off. |
| 0781875 | 7/1997 | European Pat. Off. |
| 0826796 | 3/1998 | European Pat. Off. |
| 0834607 | 4/1998 | European Pat. Off. |
| 0866151 | 9/1998 | European Pat. Off. |
| 3-295893 | 12/1991 | Japan |
| 4-321583 | 11/1992 | Japan |
| 05270974 | 10/1993 | Japan |
| 5-270968 | 10/1993 | Japan |
| 5-270974 | 10/1993 | Japan |
| 5-270975 | 10/1993 | Japan |
| 5-270976 | 10/1993 | Japan |
| 07172981 | 7/1995 | Japan |
| 7-172981 | 7/1995 | Japan |
| 9-2893 | 1/1997 | Japan |

*Primary Examiner*—Pelisa Hiteshew
*Attorney, Agent, or Firm*—McDermott, Will & Emery

[57] ABSTRACT

The object of the present invention is to provide an apparatus and a method for preventing dropping of a single crystal having large diameter and heavy weight in a chamber with reduced pressure and for pulling it in reliable and safe manner. After a seed crystal 24a is immersed in Si melt in a quartz crucible 14, the seed crystal is pulled up, and a neck portion 1a with small diameter is formed under the seed crystal 24a, and a spherical constricted portion 1b is formed under the neck portion 1a, whereby a tip 23a of a single crystal support 23 is opened so that it does not come into contact with the constricted portion 1b under pulling operation. When a second neck portion 1c under the constricted portion 1b is moved up to a standby position of the tip 23a of the single crystal support 23, rotation of an upper chamber 12 is started, and a rotating shaft 22 is rotated clockwise, and the tip 23a of the single crystal support 23 is closed to grip a site under the constricted portion 1b and the single crystal support 23 is moved up at the same rate as that of the wire 3 by rotating a ball screw shaft 21.

16 Claims, 9 Drawing Sheets

12 UPPER CHAMBER

12 UPPER CHAMBER

SINGLE CRYSTAL GROWING APPARATUS AND SINGLE CRYSTAL GROWING METHOD

BACKGROUND OF THE INVENTION

1. Field of the Invention

The present invention relates to a single crystal growing apparatus and a single crystal growing method for manufacturing a dislocation-free single crystal of silicon by the pulling Czochralski method.

2. Description of the Prior Art

In a single crystal manufacturing apparatus based on the pulling Czochralski (CZ) method, fresh argon (Ar) gas is supplied into a highly pressure-proof airtight chamber where pressure is reduced to about 10 torr in advance and polycrystal in a quartz crucible arranged in the lower portion of the chamber is melted by heating. Then, a seed crystal is immersed into surface of the melt from above, and by rotating and moving up and down the seed crystal and the quartz crucible, the seed crystal is pulled up. As a result, a single crystal (the so-called ingot) is grown, which comprises an upper cone portion with its upper end protruding, a cylindrical body portion, and a lower cone portion with its lower end protruding, all under the seed crystal.

As a method to grow as described above, Dash method is known. According to this method, in order to eliminate dislocation (i.e. in order to turn to dislocation-free), which occurs in the seed crystal due to thermal shock when the seed crystal is immersed to the surface of the melt, pulling rate is relatively increased after immersing the seed crystal to the surface of the melt so that a neck portion having smaller diameter than the seed crystal, e.g. 3 to 4 mm, is formed, and pulling of the upper cone portion is started.

Further, a single crystal having large diameter and heavy weight (150 to 200 kg or more) cannot be pulled up via the neck portion with small diameter, and a method has been proposed, for example, in JP-B-5-65477. According to this method, a neck portion with small diameter is formed by Dash method, and the pulling rate is then relatively slowed down and a portion with larger diameter is formed. Then, the pulling rate is relatively increased, and a portion with small diameter is formed. Thus, a "spherical constricted portion" is formed, and by gripping this constricted portion with a gripper, the single crystal having large diameter and heavy weight is pulled up. Also, a conventional type apparatus for gripping the constricted portion is proposed, for example, in JP-B-7-103000 and JP-B-7-515.

As other conventional examples, a method for directly gripping a body portion with a "constricted portion" as described above has been proposed, for example, in JP-A-5-270974 or JP-A-7-172981. Also, a method to form a "ring-like constricted portion" having a larger diameter than the body portion between the upper cone portion and the body portion instead of the above "spherical constricted portion" and to grip this "ring-like constricted portion" has been proposed in JP-A-63-252991 and JP-A-5-270975.

However, in each of the conventional type gripping members as described above, there are problems in that it is not very practical to use a gripper and a power transmission mechanism to suspend a single crystal having large diameter and heavy weight (e.g. with a body portion of 400 mm in diameter and 400 kg in weight) in a chamber where pressure is reduced to about 10 torr using vacuum pump. If the single crystal is detached from the gripper and is dropped down, dislocation may occur, and the single crystal is not qualified as a product any more. When the quartz crucible is damaged, high temperature melt may react in the worst case with the cooling water inside the crucible shaft, which rotates and moves up and down the quartz crucible, and vapor explosion may occur. The present applicant has previously filed JP-A-9-93182 and proposed a single crystal pulling apparatus for pulling a single crystal with heavy weight. It is proposed in this patent application that a pulling chamber is divided to an upper and a lower chambers, and the upper chamber itself is rotated. (This proposal is not yet presented in publication, and this does not constitute a prior art to the present invention.) In this case, however, the upper chamber itself is sometimes as heavy as several tons by itself, and it requires a large-scale rotating mechanism and also much cost.

SUMMARY OF THE INVENTION

To solve the problems of the conventional apparatuses and also the problems of the apparatus as proposed in the previous application filed by the present applicant, it is an object of the present invention to provide a single crystal growing apparatus and a single crystal growing method, by which it is possible to prevent dropping of the single crystal having large diameter and heavy weight in a chamber with reduced pressure and to provide the function to prevent dropping of a single crystal rod, thereby ensuring the achievement of pulling operation in reliable and safe manner.

To attain the above object, the apparatus according to the first aspect of the present invention comprises a chamber divided to a lower chamber and an upper chamber rotatably arranged, and a single crystal gripping mechanism movable in vertical direction is disposed in the upper chamber, whereby a neck portion of a single crystal is formed under a seed crystal, the seed crystal is supported and pulled up until a constricted portion of the single crystal is formed under the neck portion, and then, the constricted portion is supported and pulled up by the single crystal gripping mechanism in the upper chamber.

According to the first aspect of the present invention, there is provided a single crystal growing apparatus, comprising: a lower chamber having a quartz crucible arranged in it;

an upper chamber rotatably disposed above said lower chamber;

a seed crystal lift mechanism rotatably disposed above said upper chamber with respect to said lower chamber and for moving the seed crystal up or down; and a single crystal gripping mechanism arranged in such manner that it can be moved in vertical direction in said upper chamber, whereby:

said seed crystal lift mechanism forms a neck portion of the single crystal under the seed crystal by immersing the seed crystal in a melt in said quartz crucible and by pulling it and is used to form a constricted portion of the single crystal under said neck portion, and said single crystal gripping mechanism is used to pull the single crystal by gripping said constricted portion from below and by moving up after the constricted portion of said single crystal has been formed.

In addition, according to the first aspect of the present invention, there is provided a single crystal growing method using a single crystal growing apparatus, which comprises a lower chamber having a quartz crucible arranged in it, an upper chamber rotatably disposed above said lower chamber, a seed crystal lift mechanism rotatably disposed above said upper chamber with respect to said lower chamber and for moving the seed crystal up or down, and a single crystal gripping mechanism arranged in such manner that it can be moved in vertical direction in said upper chamber, whereby said method comprises the steps of:

immersing and adapting the seed crystal into a melt in said quartz crucible using said seed crystal lift mechanism;

forming a neck portion of the single crystal under said seed crystal by pulling said seed crystal using said seed crystal lift mechanism;

forming a constricted portion of the single crystal under said neck portion;

gripping the constricted portion of said single crystal from below using said single crystal gripping mechanism; and pulling said seed crystal and said constricted portion of the single crystal using said seed crystal lift mechanism and said single crystal gripping mechanism and for growing the single crystal.

To attain the above object, the second aspect of the invention comprises a chamber divided to a lower chamber and an upper chamber, and a portion of a single crystal gripping mechanism movable in vertical direction is disposed in the upper chamber, whereby a neck portion of a single crystal is formed under a seed crystal, the seed crystal is supported and pulled up until a constricted portion of the single crystal is formed under the neck portion, and then, the constricted portion is supported and pulled up by the single crystal gripping mechanism in the upper chamber.

According to the second aspect of the present invention, there is provided a single crystal growing apparatus, comprising:

a lower chamber having a quartz crucible arranged in it;

an upper chamber disposed above said lower chamber;

a seed crystal lift mechanism rotatably disposed above said upper chamber with respect to said lower chamber and said upper chamber and for moving the seed crystal up or down;

a single crystal support disposed as movable in vertical direction within said upper chamber;

a means for moving up said single crystal support; and a means rotatable with respect to said upper chamber and for rotating said single crystal support around pulling axis of said seed crystal within said upper chamber, whereby:

said seed crystal lift mechanism immerses a seed crystal into a melt in said quartz crucible and pulls up said seed crystal to form a neck portion of a single crystal under the seed crystal and then forms a constricted portion of the single crystal under said neck portion, and said single crystal support, said means for moving up, and said means for rotating are used to pull up the single crystal, by gripping said constricted portion from below after the constricted portion of the single crystal has been formed, and to move up said constricted portion.

In addition, according to the second aspect of the present invention, there is provided a single crystal growing method using a single crystal growing apparatus, comprising a lower chamber having a quartz crucible arranged in it; an upper chamber disposed above said lower chamber; a seed crystal lift mechanism rotatably disposed above said upper chamber with respect to said lower chamber and said upper chamber and for moving the seed crystal up or down; a single crystal support disposed as movable in vertical direction within said upper chamber; a means for moving up said single crystal support; and a means rotatable with respect to said upper chamber and for rotating said single crystal support around pulling axis of said seed crystal within said upper chamber, whereby said method comprises the steps of:

immersing the seed crystal into and adapting it to a melt in said quartz crucible by said seed crystal lift mechanism;

forming a neck portion of the single crystal under said seed crystal by pulling said seed crystal by said seed crystal lift mechanism;

forming a constricted portion of the single crystal under said neck portion;

gripping said constricted portion of said single crystal from below by said single crystal support; and growing the single crystal by pulling said seed crystal and the constricted portion of said single crystal by said seed crystal lift mechanism and said means for moving up.

BRIEF DESCRIPTION OF THE DRAWINGS

The above-mentioned objects and features will become more readily apparent from the following description of the embodiment taken in conjunction with the accompanying drawings in which.

DETAILED DESCRIPTION OF THE PREFERRED EMBODIMENTS

In the following, description will be given on the preferred embodiments of the present invention referring to the attached drawings.

(1st Embodiment)

Figure 1:
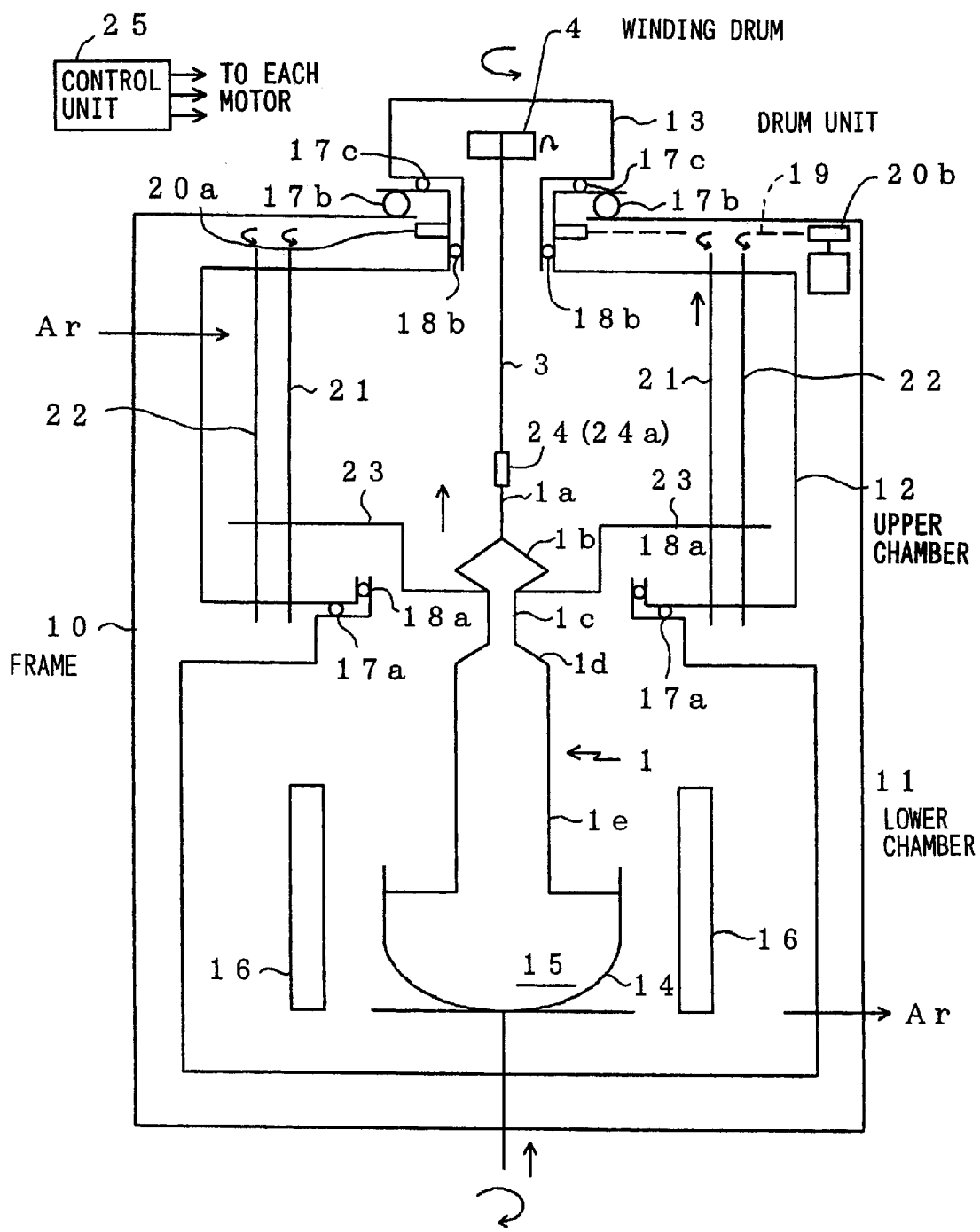
FIG. 1 is a side view schematically showing the arrangement of a first embodiment of the single crystal growing apparatus according to the present invention.
Figure 2:
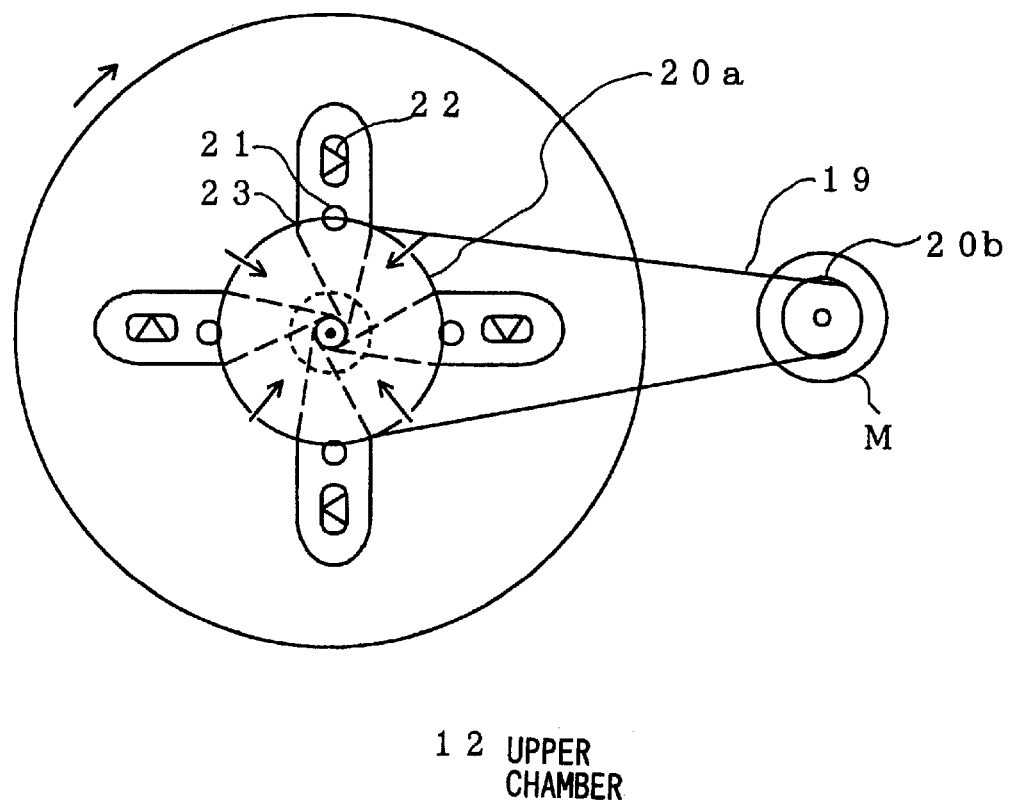
FIG. 2 is a plan view schematically showing an arrangement of an upper chamber of FIG. 1.
Figure 3:
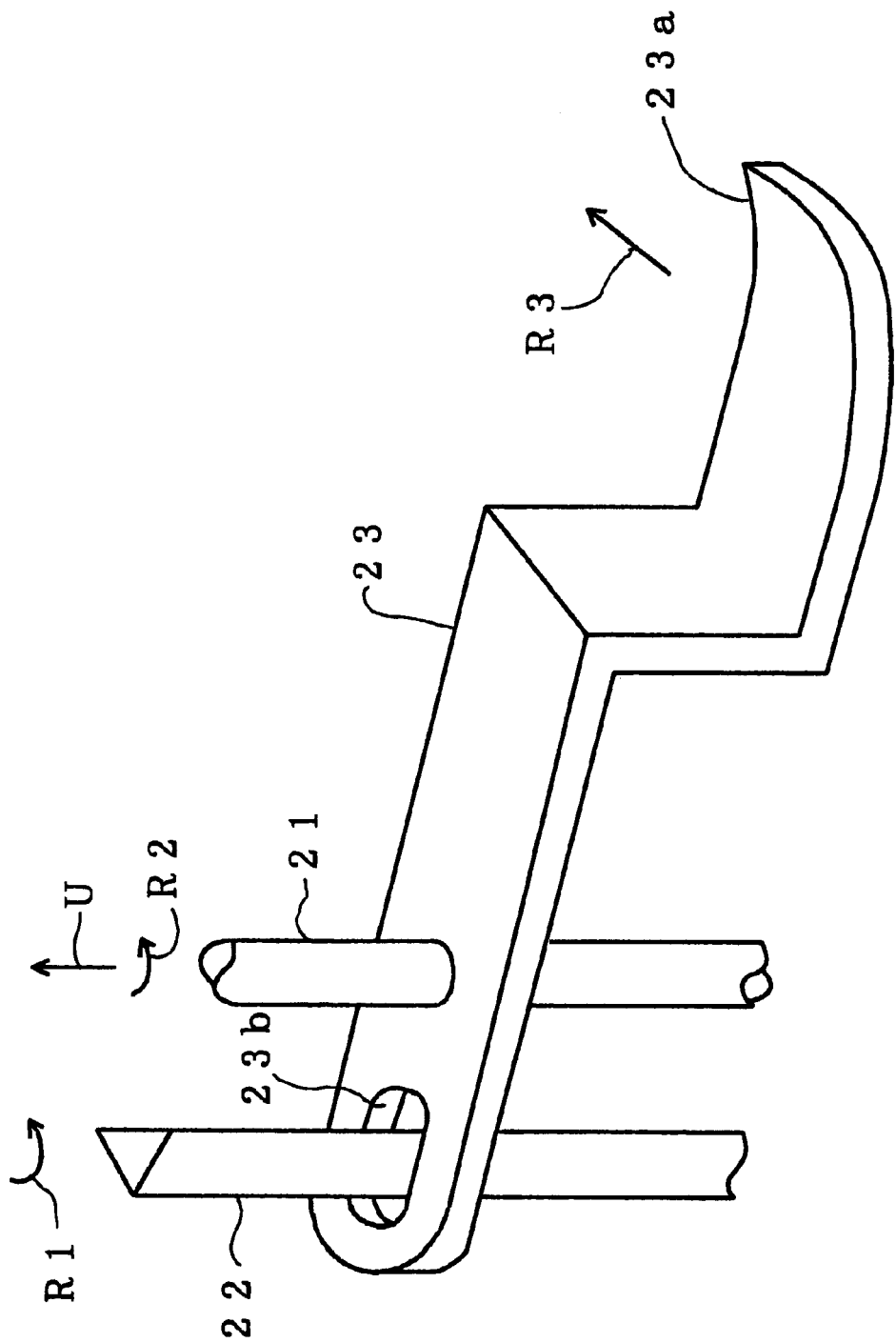
FIG. 3 is a perspective view showing the single crystal growing apparatus of FIGS. 1 and 2.
Figure 4A:
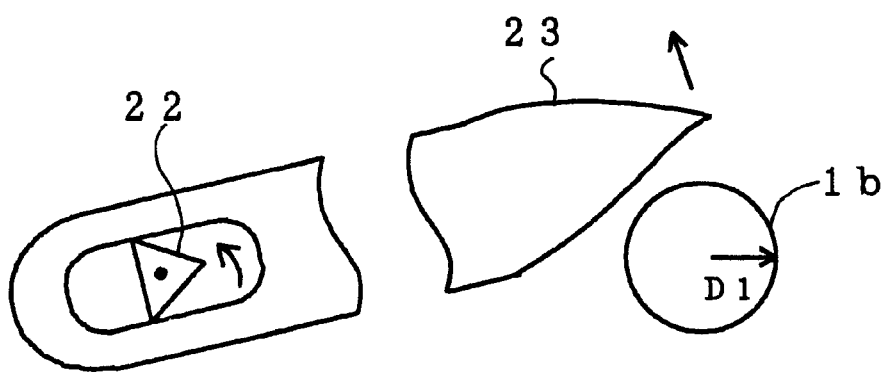
FIGS. 4A and 4B are explanatory diagrams showing the operation of the single crystal gripping mechanism of FIG. 3.
Figure 4B:
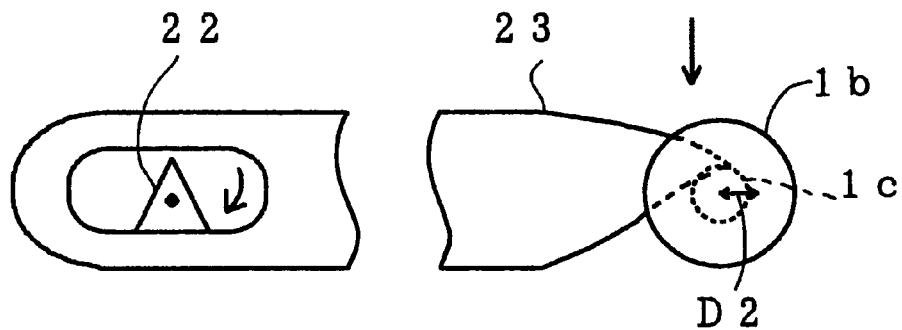

FIG. 1 is a side view schematically showing an arrangement of a first embodiment of a single crystal growing apparatus of the present invention; FIG. 2 is a plan view schematically showing an arrangement of an upper chamber of FIG. 1; FIG. 3 is a perspective view of a single crystal gripping apparatus of FIG. 1 and FIG. 2; and FIGS. 4A and 4B represent drawings to explain operation of the single crystal gripping apparatus.

In FIG. 1, a lower chamber 11 and an upper chamber 12 are arranged in a frame 10, and a drum unit 13 is disposed on the frame 10. Each of the chambers 10 to 12 and the drum unit 13 are designed as a highly pressure-proof vacuum container, and argon gas is drawn into the upper chamber 12 and is discharged from the lower chamber 11. The lower chamber 11 is fixed on the lower portion of the frame 10. In the lower chamber 11, there are provided a quartz crucible 14 for pulling up a single crystal 1 and a heater 16 for melting a polycrystal 15 in the quartz crucible 14. The quartz crucible 14 is supported in such manner that it can be rotated and moved in vertical direction.

The upper chamber 12 is designed in water-cooled jacket type, and it is rotatably supported on the lower chamber 11 via ball bearings 17a and vacuum seals 18a. The upper chamber 12 is also rotatably supported with respect to the frame 10 via ball bearings 17b. As shown in FIG. 2, the upper chamber 12 is connected to an upper chamber rotating motor M via a belt 19 and pulleys 20A and 20B. When the motor M is rotated, the upper chamber 12 is rotated.

Further, the drum unit 13 is rotatably supported with respect to the frame 10 via ball bearings 17c, and vacuum seals 18b are provided between the drum unit 13 and the upper chamber 12. In the drum unit 13, there are provided a winding drum 4 and a wire winding motor (not shown) for winding up a wire 3 for pulling the single crystal. The drum 13 is rotated by a drum rotating motor (not shown). The wire 3, the winding drum 4, and the wire winding motor constitute a seed crystal lift mechanism. Instead of the wire 3, a shaft as well as a shaft lift mechanism and shaft rotating mechanism may be provided to pull up the single crystal 1.

As shown in FIG. 2 to FIGS. 4A and 4B in detail, there are provided in the upper chamber 12, 4 sets of ball screw shafts 21 and rotating shafts 22 each having triangular cross-section, all extending vertical direction and rotatably synchronized with a motor (not shown). A tip 23a of each of single crystal supports 23 is designed in narrow shape to grip the single crystal 1. On the single crystal support 23, an oblong opening 23b is formed so that it can be engaged with the rotating shaft 22. The oblong opening 23b and the rotating shaft 22 engaged with and passing through it constitute a cam mechanism to rotate the single crystal support 23. As shown in FIG. 3, the single crystal support 23 is movably supported in such manner that, when the ball screw shaft 21 is turned in the direction of an arrow R2, the single crystal support is moved up in the direction of an arrow U, i.e. in vertical direction, and when the rotating shaft 22 is turned in the direction of an arrow R1, the tip 23a is turned to the direction shown by an arrow R3. The ball screw shaft 21, the rotating shaft 22, a motor (not shown), and the single crystal support 23 make up a single crystal gripping mechanism.

Control signals as described later are sent from a control unit 25 to the chamber rotating motor M, the drum rotating motor, the wire winding motor, and the ball screw shaft rotating motor. In the control unit 25, temperature information of the quartz crucible 14 and diameter information of the single crystal rod under growth are given from a temperature sensor or a CCD camera (both not shown in the figure).

When the single crystal 1 is manufactured under the above arrangement, pressure is reduced in the chambers 10 to 12 and the drum unit 13, and argon gas is supplied. At the same time, the polycrystal 15 in the quartz crucible 14 is heated by a heater 16 and is melted. A seed crystal 24a is mounted on a seed crystal holder 24 placed at the tip of the wire 3, and the wire winding drum 4 is rotated and the wire 3 is moved down so that the seed crystal 24a is immersed into Si melt in the quartz crucible 14. In this case, as shown in FIG. 4A, the rotating shaft 22 is rotated counterclockwise, and the tip 23a of the single crystal support 23 is opened wider than the diameter D1 of a constricted portion (to be described later), and the single crystal support 23 waits at lower position.

Next, after the seed crystal 24a has been immersed in the Si melt in the quartz crucible 14 and after a predetermined time has elapsed, the seed crystal 24a is pulled up at relatively high pulling rate, and a neck portion 1a having small diameter (3 to 4 mm) is formed under the seed crystal 24a. Then, the pulling rate is relatively slowed down to form a portion with larger diameter D1. Next, by relatively increasing the pulling rate, a spherical constricted portion 1b is formed under the neck portion 1a. In this case, as shown in FIG. 4A, the tip 23a of the single crystal support 23 is opened so that it does not touch the constricted portion 1b during pulling operation. That is, the tip 23a is at a first position away from under the constricted portion 1b. During pulling operation, the drum unit 13, i.e. the seed crystal 24a and the quartz crucible 14, is rotated. Further, the quartz crucible 14 is moved up to the same level as the surface of the Si melt.

When the constricted portion 1b is formed, a second neck portion 1c having diameter larger than the neck portion 1a with small diameter and having a diameter D2 smaller than the diameter D2 of the constricted portion 1b is formed under the constricted portion so that it can endure the weight of the finished single crystal 1 (e.g. 400 kg). Next, by gradually slowing down the pulling rate, an upper cone 1d is formed. Then, by pulling up at a constant rate, a cylindrical body portion 1e is formed. In the pulling process up to this moment, the single crystal 1 is supported only via the neck portion 1a with small diameter, and the limit of weight is 100 kg or less.

Next, in order to support the site under the constricted portion 1b by the single crystal support 23 before the neck portion 1a is broken during pulling operation of the body portion 1e by the wire 3, rotation of the upper chamber 12 is started when the second neck portion 1c under the constricted portion 1b is moved up to the standby position of the tip of 23a of the single crystal support 23. As shown in FIG. 4B, the rotating shaft 22 is rotated clockwise and the tip 23a of the single crystal support 23 is closed, i.e. the tip 23a is at a second position under the constricted portion 1b and grips the site under the constricted portion 1b. Further, by rotating the ball screw shaft 21, the single crystal support 23 is moved up at the same rate as the wire 3. To perform synchronous operation as described above, a predetermined control signal for synchronizing is given from the control unit 25 including computer so that the motor for driving the winding drum 4 is synchronized with the motor for rotating the ball screw shaft 21.

During the synchronous operation, four ball screw shafts 21 are synchronized with the drum unit 13 and are rotated around axis of the single crystal, and the single crystal 1 is not dislocated. That is, the motor M for rotating the upper chamber 12 is controlled by the control unit 25 in such manner that it is synchronously rotated with the motor for rotating the drum unit 13. During the pulling operation of the body portion 1e, the single crystal 1 is supported and pulled up by the single crystal support 23 (and the wire 3). In this way, the single crystal support 23 and its tip 23a can be rotated in a plane, which is substantially perpendicular to pulling direction of the single crystal 1. When the tip 23a is at closed position under the constricted portion 1b, it is firmly supported by the above cam mechanism. Thus, it can firmly retain without dropping the constricted portion 1b.

Figure 5:
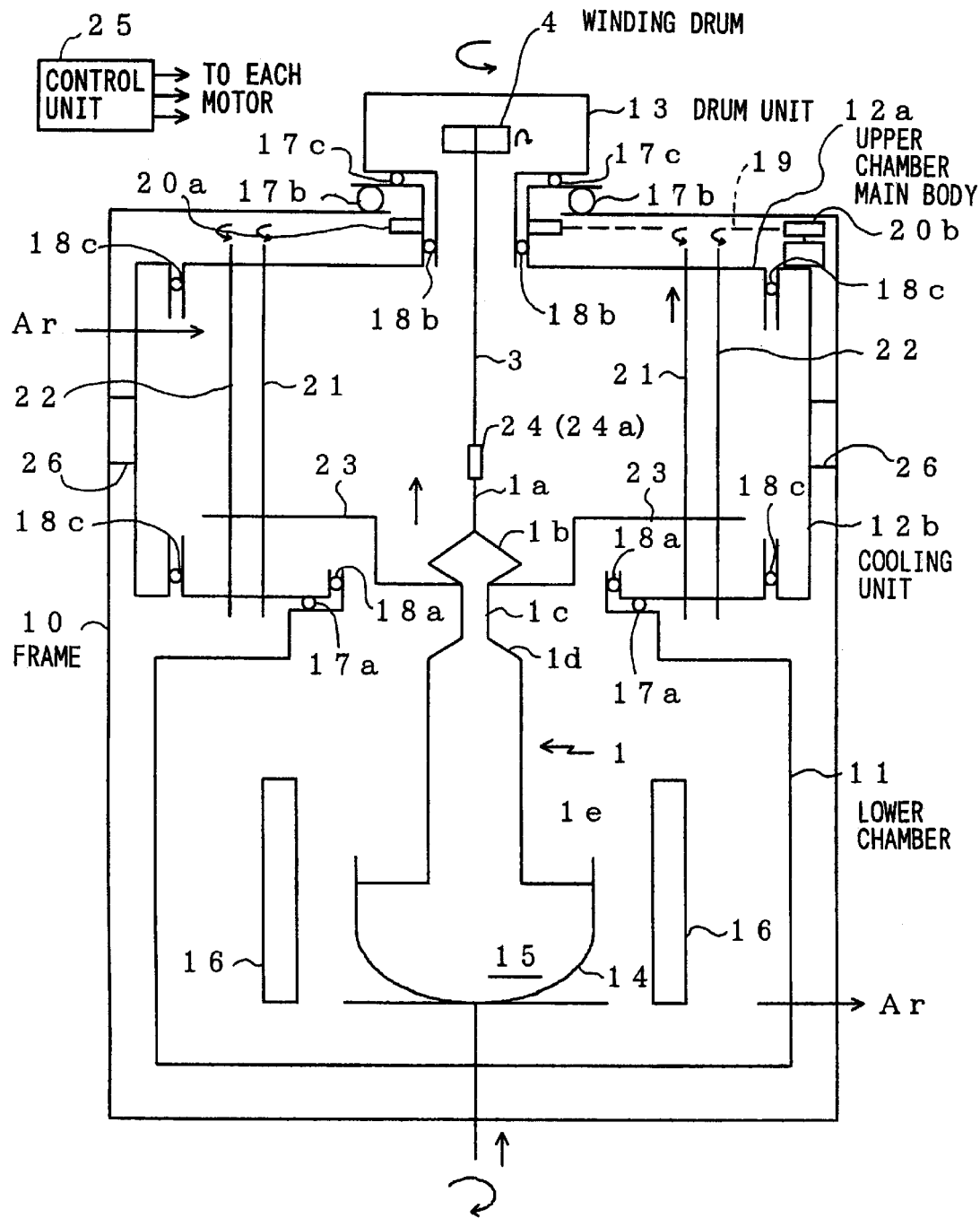
FIG. 5 is a side view of a variation of the single crystal growing apparatus of FIG. 1.
Figure 6:
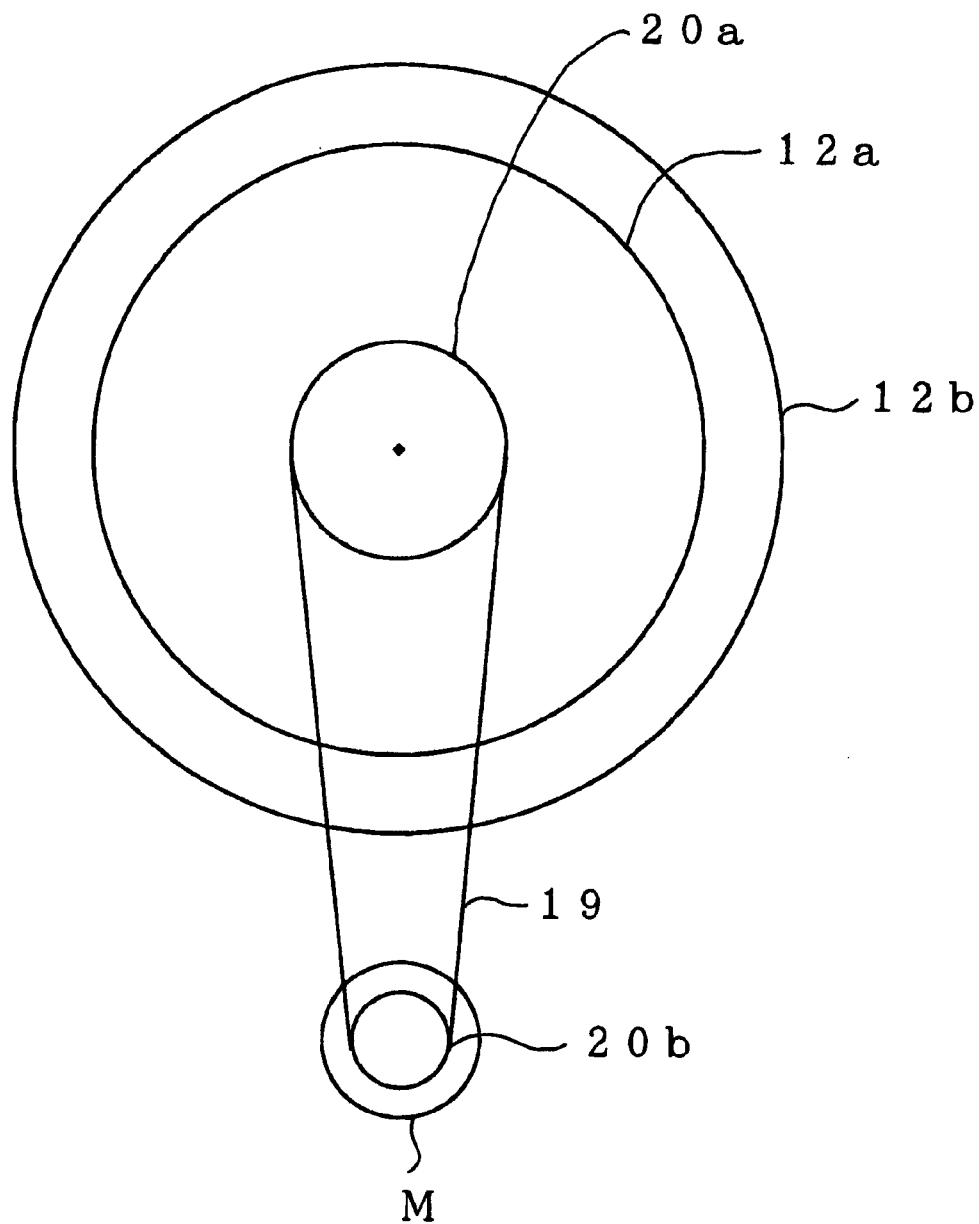
FIG. 6 is a plan view to schematically show the arrangement of an upper chamber in FIG. 5.

FIG. 5 shows a variation of the apparatus of FIG. 1. The upper chamber 12 is divided to an upper chamber main body 12a and a cooling unit 12b. Similarly to the upper chamber 12 shown in FIG. 1, the upper chamber main body 12a is rotatably supported on the lower chamber 11 via ball bearings 17a and vacuum seals 18a, and it is also rotatably supported with respect to the frame 10 via ball bearings 17b. As shown in FIG. 6, it is connected to the upper chamber rotating motor M via a belt 19 and pulleys 20A and 20B, and it is rotated when the motor M is rotated.

In contrast, the cooling unit 12b is arranged around the upper chamber main body 12a and is fixed on the frame 10 by support members 26, and vacuum seals 18c are provided between the cooling unit 12b and the upper chamber main body 12a. Under such arrangement, the cooling unit 12b, constituting the upper chamber 12, is not rotated, and only the upper chamber main body 12a is rotated. Thus, it is possible to prevent uneven rotation by decreasing the load during rotation, and also to prevent dislocation.

(2nd Embodiment)

Figure 7:
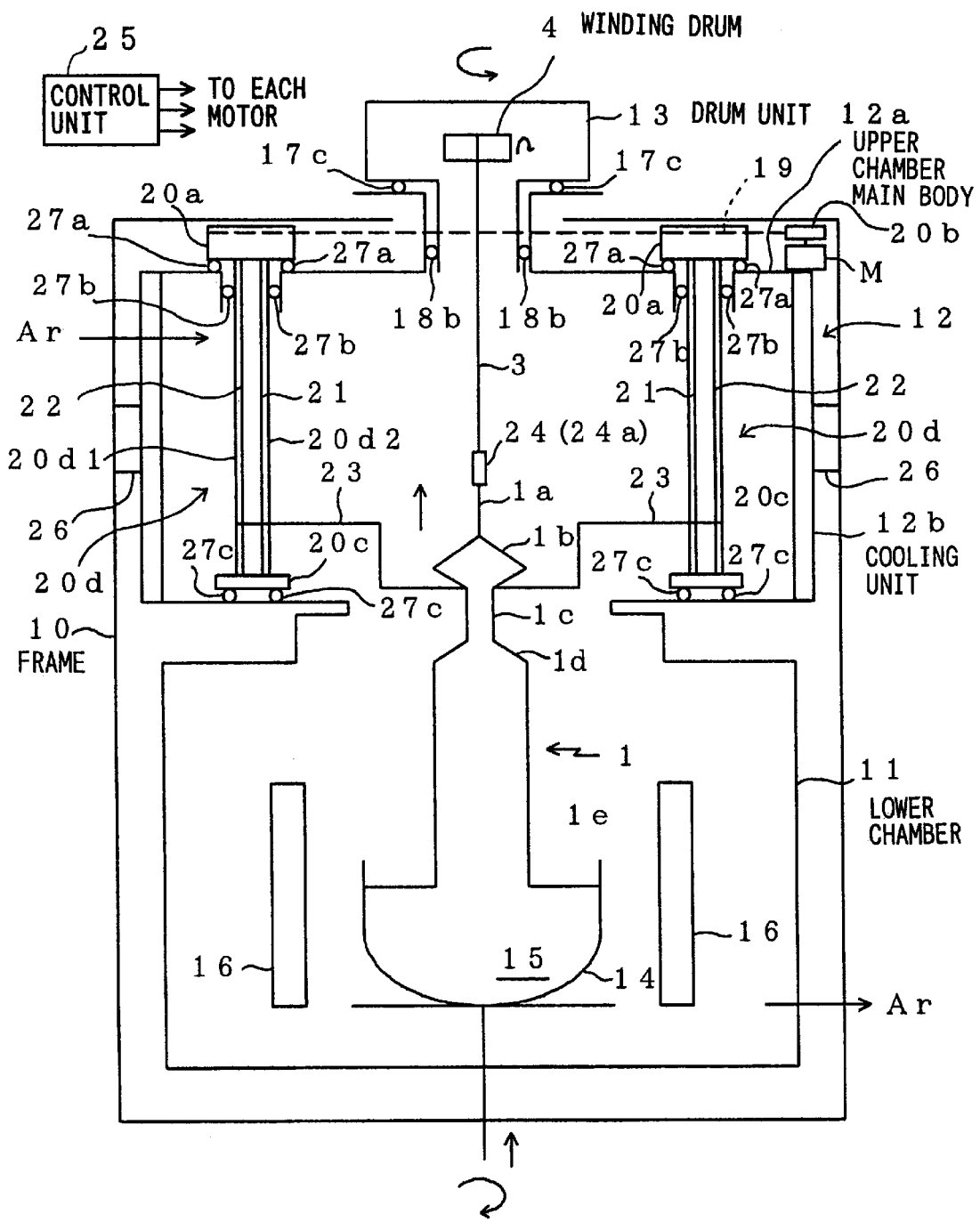
FIG. 7 is a lateral sectional view schematically showing an arrangement of a second embodiment of the single crystal growing apparatus of the present invention.
Figure 8:
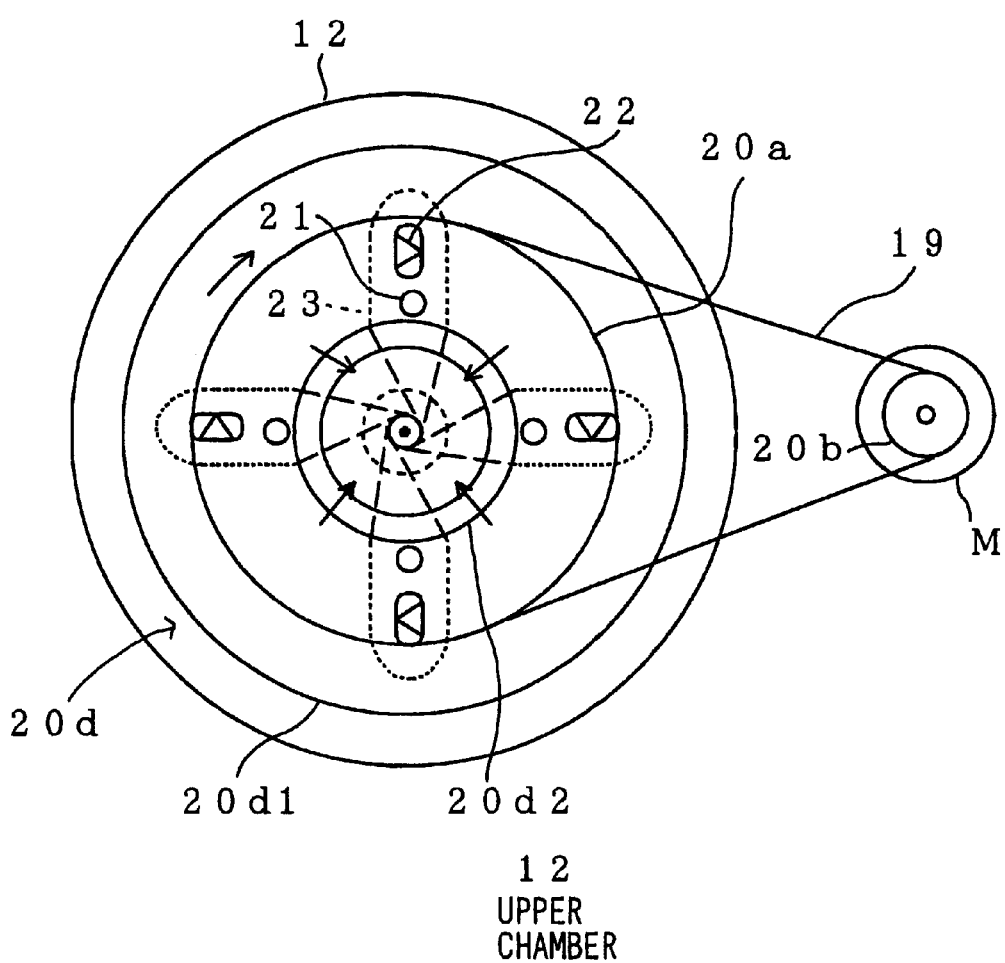
FIG. 8 is a perspective plan view schematically showing an arrangement of an upper chamber and a single crystal gripping mechanism of FIG. 7.
Figure 9:
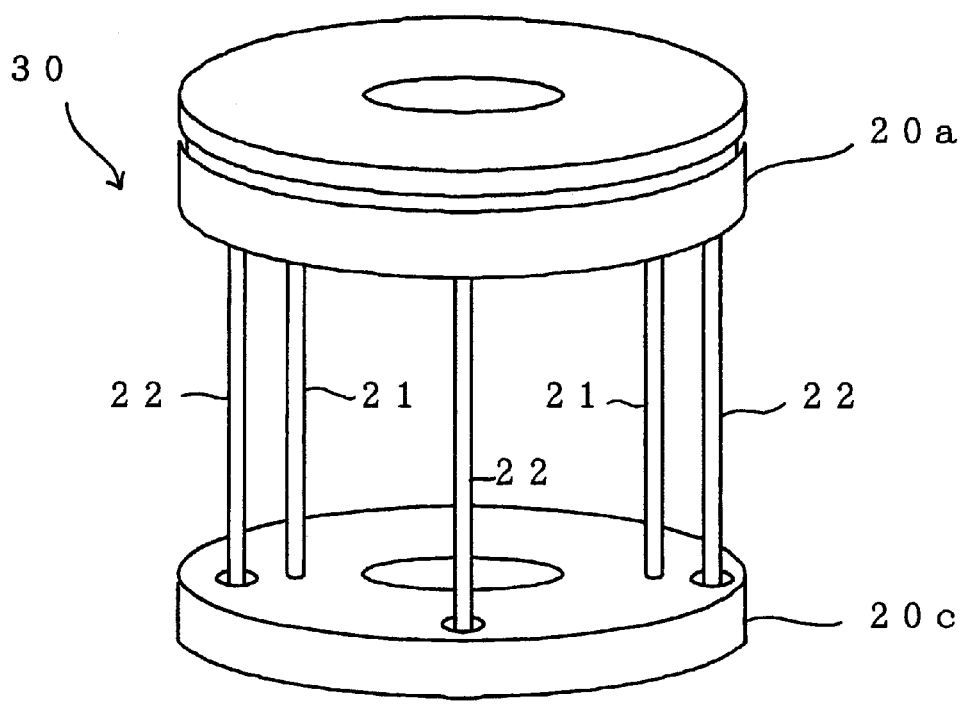
FIG. 9 is a perspective view of the single crystal gripping mechanism of FIG. 7 and FIG. 8 when the cylinder unit and the single crystal support are removed.

FIG. 7 is a lateral sectional view schematically showing an arrangement of another embodiment of the single crystal growing apparatus of the present invention; FIG. 8 is a perspective plan view schematically showing an arrangement of the upper chamber and the single crystal gripping mechanism of FIG. 7; and FIG. 9 is a perspective view of the single crystal gripping mechanism of FIG. 7 and FIG. 8 when the cylindrical unit and the single crystal support are removed.

In FIG. 7, a lower chamber 11 and an upper chamber 12 are arranged in a frame 10, and a drum unit 13 is disposed on the frame 10. Each of the chambers 10 to 12 and the drum unit 13 is designed as a highly pressure-proof vacuum container, and argon gas is drawn into the upper chamber 12 and is discharged from the lower chamber 11. The lower chamber 11 is fixed on lower portion of the frame 10. In the lower chamber 11, there are provided a quartz crucible 14 for pulling a single crystal 1 and a heater 16 for melting a polycrystal 15 in the quartz crucible 14. The quartz crucible 14 is supported in such manner that it can be rotated and moved in vertical direction.

The upper chamber 12 is designed in water-cooled jacket type. Specifically, the upper chamber 12 comprises an upper chamber main body 12a and a cooling unit 12b arranged around it, and the entire upper chamber 12 is fixed and supported on the lower chamber 11. On the upper portion of the upper chamber 12, annular members 20a are supported via ball bearings 27a so that these annular members can be rotated around the pulling axis of the single crystal with respect to the upper chamber 12. As shown in FIG. 8, the annular members 20a arranged on the upper portion of the upper chamber 12 are operated as pulleys and are connected to an annular member rotating motor M via a belt 19 and pulleys 20b. When the motor M is rotated, the annular members 20a are rotated. The annular members 20a constitute a part of a single crystal gripping mechanism 30 (FIG. 9) to be described later and are used to rotate the single crystal gripping mechanism 30 around the pulling axis of the single crystal.

The single crystal gripping mechanism 30 comprises, in addition to the annular members 20a, other annular members 20c movably arranged on the bottom of the upper chamber 12 via ball bearings 27c and cylinder units 20d, which connect two types of annular members 20a and 20c. That is, the annular members 20a and 20c are fixed on upper and lower ends of the hollow cylinder units 20d. Outer periphery and inner periphery of the cylinder unit 20d are rotatably supported with respect to the upper chamber 12 via ball bearings 27b. Near the ball bearings 27b, vacuum seal members (not shown) are provided to maintain airtightness inside the upper chamber 12.

The single crystal gripping mechanism 30 comprises, as shown in FIG. 8 and FIG. 9 in detail, 4 sets of ball screw shafts 21, rotating shafts 22 each having triangular cross-section, and single crystal supports 23. The ball screw shafts 21 and the rotating shafts 22 are extended in vertical direction between the upper annular member 20a and the lower annular member 20c and also in the space between an outer peripheral wall 20d1 and an inner peripheral wall 20d2 of the cylinder unit 20d and are rotatably mounted around these shafts. As shown in FIG. 3 explained in the first embodiment, the single crystal support 23 is screwed on each of the ball screw shafts 21. When the ball screw shaft 21 is rotated, the single crystal support 23 can be moved in vertical direction. A tip 23a of the single crystal support 23 is designed in narrow shape so that it can grip the single crystal 1. On the single crystal support 23, an oblong opening 23b to engage with the rotating shaft 22 is formed. The oblong opening 23b and the rotating shaft 22 engaged with and passing through it constitute a cam mechanism for turning the single crystal support 23. As shown in FIG. 3, the single crystal support 23 is movably supported in such manner that, when the ball screw shaft 21 is turned in the direction of an arrow R2, the single crystal support is moved up in the direction of an arrow U, i.e. in vertical direction, and when the rotating shaft 22 is turned in the direction of an arrow R1, the tip 23a is turned to the direction shown by an arrow R3. The ball screw shaft 21, the rotating shaft 22, the annular members 20a and 20c, and the single crystal support 23 constitute the single crystal gripping mechanism 30 as described above. FIG. 9 shows the single crystal gripping mechanism 30 when the cylinder unit 20d and the single crystal support 23 are removed. The ball screw shaft 21 is rotated by a ball screw shaft rotating motor (not shown) mounted inside the annular member 20a, and the rotating shaft 22 is also similarly turned by a cam shaft rotating motor (not shown) mounted inside the annular member 20a. On the inner wall 20d2 of the cylinder unit 20d, an opening (not shown) is provided partially so that the single crystal support 23 can be moved up and down within a predetermined range.

Control signals to be described later are supplied from the control unit 25 to the annular member rotating motor M, the drum rotating motor, the wire winding motor, the ball screw shaft rotating motor, and the cam shaft rotating motor. To the control unit 25, temperature information of the quartz crucible 14 and diameter information of the single crystal rod 1 under growth are given from a temperature sensor or a CCD camera (both not shown in the figure).

When the single crystal 1 is manufactured under the above arrangement, pressure is reduced in the chambers 10 to 12 and the drum unit 13, and argon gas is supplied. At the same time, the polycrystal 15 in the quartz crucible 14 is heated by a heater 16 and is melted. A seed crystal 24a is mounted on a seed crystal holder 24 placed at the tip of the wire 3, and the wire winding drum 4 is rotated and the wire 3 is moved down so that the seed crystal 24a is immersed into Si melt in the quartz crucible 14. In this case, as shown in FIG. 4A, the rotating shaft 22 is rotated counterclockwise, and the tip 23a of the single crystal support 23 is opened wider than the diameter D1 of a constricted portion (to be described later), and the single crystal support 23 waits at lower position.

Next, after the seed crystal 24a has been immersed in the Si melt in the quartz crucible 14 and after a predetermined time has elapsed, the seed crystal 24a is pulled up at relatively high pulling rate, and a neck portion 1a having small diameter (3 to 4 mm) is formed under the seed crystal 24a. Then, the pulling rate is relatively slowed down to form a portion with larger diameter D1. Next, by relatively increasing the pulling rate, a spherical constricted portion 1b is formed under the neck portion 1a. In this case, as shown in FIG. 4A, the tip 23a of the single crystal support 23 is opened so that it does not touch the constricted portion 1b during pulling operation. That is, the tip 23a is at a first position away from under the constricted portion 1b. During pulling operation, the drum unit 13, i.e. the seed crystal 24a and the quartz crucible 14, is rotated. Further, the quartz crucible 14 is moved up to the same level as the surface of the Si melt.

When the constricted portion 1b is formed, a second neck portion 1c having diameter larger than the neck portion 1a with small diameter and having a diameter D2 smaller than the diameter D2 of the constricted portion 1b is formed under the constricted portion so that it can endure the weight of the finished single crystal 1 (e.g. 400 kg). Next, by gradually slowing down the pulling rate, an upper cone 1d is formed. Then, by pulling up at a constant rate, a cylindrical body portion 1e is formed. In the pulling process up to this moment, the single crystal 1 is supported only via the neck portion 1a with small diameter, and the limit of weight is 100 kg or less.

Next, in order to support the site under the constricted portion 1b by the single crystal support 23 before the neck portion 1a is broken during pulling operation of the body portion 1e by the wire 3, rotation of the annular member 20a is started by the motor M when the second neck portion 1c under the constricted portion 1b is moved up to the standby position of the tip of 23a of the single crystal support 23. As shown in FIG. 4B, the rotating shaft 22 is rotated clockwise and the tip 23a of the single crystal support 23 is closed, i.e. the tip 23a is at a second position under the constricted portion 1b and grips the site under the constricted portion 1b. Further, by rotating the ball screw shaft 21, the single crystal support 23 is moved up at the same rate as the wire 3. To perform synchronous operation as described above, a predetermined control signal for synchronizing is given from the control unit 25 including computer so that the motor for driving the winding drum 4 is synchronized with the motor for rotating the ball screw shaft 21.

During the synchronous operation, four ball screw shafts 21 are synchronized with the drum unit 13 and are rotated around axis of the single crystal, and the single crystal 1 is not dislocated. That is, the motor M for rotating the annular member 20a is controlled by the control unit 25 in such manner that it is synchronously rotated with the motor for rotating the drum unit 13. During the pulling operation of the body portion 1e, the single crystal 1 is supported and pulled up by the single crystal support 23 (and the wire 3). In this way, the single crystal support 23 and its tip 23a can be rotated in a plane, which is substantially perpendicular to pulling direction of the single crystal 1. When the tip 23a is at closed position under the constricted portion 1b, it is firmly supported by the above cam mechanism. Thus, it can firmly retain without dropping the constricted portion 1b.

As described above, the apparatus according to the first aspect of the present invention comprises a chamber divided to a lower chamber and an upper chamber rotatably arranged, and a single crystal gripping mechanism movable in vertical direction is disposed in the upper chamber, whereby a neck portion of a single crystal is formed under a seed crystal, the seed crystal is supported and pulled up until a constricted portion of the single crystal is formed under the neck portion, and then, the constricted portion is supported and pulled up by the single crystal gripping mechanism in the upper chamber. As a result, it is possible to prevent dropping of the single crystal having large diameter and heavy weight in a chamber with reduced pressure and to pull the single crystal in reliable and safe manner.

Also, the apparatus according to the second aspect of the invention comprises a chamber divided to a lower chamber and an upper chamber, and a portion of a single crystal gripping mechanism movable in vertical direction is disposed in the upper chamber, whereby a neck portion of a single crystal is formed under a seed crystal, the seed crystal is supported and pulled up until a constricted portion of the single crystal is formed under the neck portion, and then, the constricted portion is supported and pulled up by the single crystal gripping mechanism in the upper chamber. As a result, it is possible to prevent dropping of the single crystal having large diameter and heavy weight in a chamber with reduced pressure and to pull the single crystal in reliable and safe manner. In particular, in case the weight of the upper chamber itself is as heavy as several tons, if the arrangement to rotate the upper chamber itself as disclosed in the previous application is adopted, the rotating mechanism must be designed in large scale and this requires much cost. According to the present invention, the upper itself is fixed, and a single crystal support movable up and down is disposed in the upper chamber, and the single crystal support is rotated by annular members. In this respect, it Is possible to simplify the rotating mechanism which can be provided at low cost.

What is claimed is:

1. A single crystal growing apparatus, comprising:
   a lower chamber having a quartz crucible arranged in it;
   an upper chamber rotatably disposed above said lower chamber;
   a seed crystal lift mechanism rotatably disposed above said upper chamber with respect to said lower chamber and for moving the seed crystal up or down; and
   a single crystal gripping mechanism arranged in such manner that it can be moved in vertical direction in said upper chamber, whereby:
   said seed crystal lift mechanism forms a neck portion of the single crystal under the seed crystal by immersing the seed crystal in a melt in said quartz crucible and by pulling it and is used to form a constricted portion of the single crystal under said neck portion, and said single crystal gripping mechanism is used to pull the single crystal by gripping said constricted portion from below and by moving up after the constricted portion of said single crystal has been formed.

2. A single crystal growing apparatus according to claim 1, wherein said single crystal gripping mechanism comprises a movable member, which is movable between a first position deviated from a position under said constricted portion and a second position under said constricted portion.

3. A single crystal growing apparatus according to claim 2, wherein said single crystal gripping mechanism comprises a plurality of said movable members arranged to surround said constricted portion.

4. A single crystal growing apparatus according to claim 2, wherein said single crystal gripping mechanism comprises a cam mechanism for rotating said movable member.

5. A single crystal growing apparatus according to claim 1, wherein said movable member can be rotated in a plane, which substantially runs perpendicularly to pulling direction of said single crystal.

6. A single crystal growing apparatus according to claim 1, further comprising means for synchronizing the pulling rate induced by each of said seed crystal lift mechanism and said single crystal gripping mechanism.

7. A single crystal growing apparatus according to claim 1, further comprising means for synchronously rotating said seed crystal lift mechanism and said single crystal gripping mechanism around the axis of said single crystal.

8. A single crystal growing apparatus according to claim 1, wherein said upper chamber comprises:

an upper chamber main body having said single crystal gripping mechanism arranged in it; and a cooling unit stationarily arranged with respect to said lower chamber and arranged around said upper chamber main body and used for cooling said upper chamber main body.

9. A single crystal growing apparatus, comprising:

a lower chamber having a quartz crucible arranged in it;

an upper chamber disposed above said lower chamber;

a seed crystal lift mechanism rotatably disposed above said upper chamber with respect to said lower chamber and said upper chamber and for moving the seed crystal up or down;

a single crystal support disposed as movable in vertical direction within said upper chamber;

a means for moving up said single crystal support; and a means rotatable with respect to said upper chamber and for rotating said single crystal support around pulling axis of said seed crystal within said upper chamber, whereby:

said seed crystal lift mechanism immerses a seed crystal into a melt in said quartz crucible and pulls up said seed crystal to form a neck portion of a single crystal under the seed crystal and then forms a constricted portion of the single crystal under said neck portion, and said single crystal support, said means for moving up, and said means for rotating are used to pull up the single crystal, by gripping said constricted portion from below after the constricted portion of the single crystal has been formed, and to move up said constricted portion.

10. A single crystal growing apparatus according to claim 9, wherein said single crystal support comprises a movable member, which is movable between a first position deviated from a position under said constricted portion and a second position under said constricted portion.

11. A single crystal growing apparatus according to claim 10, wherein said movable member can be rotated within a plane substantially perpendicular with respect to pulling direction of said single crystal.

12. A single crystal growing apparatus according to claim 10, wherein said single crystal support comprises a plurality of said movable members arranged to encircle said-constricted portion.

13. A single crystal growing apparatus according to claim 10, further comprising a cam mechanism for rotating said movable member.

14. A single crystal growing apparatus according to claim 9, further comprising a means for synchronizing pulling rate of each pulling by said seed crystal lift mechanism and said means for moving up.

15. A single crystal growing apparatus according to claim 9, wherein rotation around single crystal pulling axis of said seed crystal lift mechanism is synchronized with rotation around single crystal pulling axis by said means for rotating.

16. A crystal growing apparatus according to claim 9, wherein said upper chamber comprises:

an upper chamber main body having said single crystal support arranged in it; and a cooling unit fixedly arranged with respect to said lower chamber and said upper chamber, arranged around said upper chamber main body, and used for cooling said upper chamber main body.

* * * * *